US008841769B2

(12) United States Patent
Park et al.

(10) Patent No.: US 8,841,769 B2
(45) Date of Patent: Sep. 23, 2014

(54) SEMICONDUCTOR DEVICE HAVING METAL PLUG AND METHOD OF MANUFACTURING THE SAME

(71) Applicant: Samsung Electronics Co., Ltd., Suwon-si (KR)

(72) Inventors: Sangjine Park, Yongin-si (KR); Boun Yoon, Seoul (KR); Jeongnam Han, Seoul (KR); Kee-Sang Kwon, Seoul (KR); Wonsang Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/796,195

(22) Filed: Mar. 12, 2013

(65) Prior Publication Data

US 2014/0048939 A1    Feb. 20, 2014

(30) Foreign Application Priority Data

Aug. 17, 2012    (KR) .................. 10-2012-0090179

(51) Int. Cl.
*H01L 23/48*    (2006.01)
*H01L 23/52*    (2006.01)
*H01L 21/44*    (2006.01)
*H01L 21/4763*  (2006.01)
*H01L 23/485*   (2006.01)
*H01L 23/532*   (2006.01)
*H01L 21/768*   (2006.01)

(52) U.S. Cl.
CPC ........ *H01L 23/53238* (2013.01); *H01L 23/485* (2013.01); *H01L 23/53295* (2013.01); *H01L 21/76846* (2013.01)
USPC  257/751; 257/774; 257/E23.16; 257/E21.577; 257/E21.584; 257/E21.585; 438/627; 438/637; 438/643; 438/653

(58) Field of Classification Search
USPC .................. 257/751, 774, E23.16, E21.584, 257/E21.577, E21.578, E21.585–E21.588; 438/637–640, 668, 627, 643, 653
See application file for complete search history.

(56) References Cited

U.S. PATENT DOCUMENTS

| | | | |
|---|---|---|---|
| 4,786,360 A | 11/1988 | Cote et al. | |
| 5,739,047 A | 4/1998 | Chiang | |
| 6,197,688 B1 * | 3/2001 | Simpson | 438/678 |
| 6,251,772 B1 * | 6/2001 | Brown | 438/626 |
| 6,265,257 B1 | 7/2001 | Hsu et al. | |

(Continued)

FOREIGN PATENT DOCUMENTS

| | | |
|---|---|---|
| JP | 06-333886 | 12/1994 |
| JP | 2001-176872 | 6/2001 |
| KR | 10-2009-0106159 | 10/2009 |

*Primary Examiner* — Jasmine Clark
(74) *Attorney, Agent, or Firm* — Onello & Mello, LLP

(57) ABSTRACT

A semiconductor device includes a first insulating layer on a substrate; a first contact hole passing through the first insulating layer and exposing an upper surface of the substrate; a first barrier metal layer disposed on a sidewall and at a bottom of the first contact hole and a first metal plug disposed on the first barrier metal layer and in the first contact hole. A recess region is between the first insulating layer and the first metal plug. A gap-fill layer fills the recess region; and a second insulating layer is on the gap-fill layer. A second contact hole passes through the second insulating layer and exposes the upper surface of the first metal plug. A second barrier metal layer is on a sidewall and at the bottom of the second contact hole; and a second metal plug is on the second barrier metal layer.

20 Claims, 18 Drawing Sheets

(56) References Cited

U.S. PATENT DOCUMENTS

| | | |
|---|---|---|
| 7,414,314 B2 | 8/2008 | Abe |
| 7,671,355 B2 * | 3/2010 | Kuo et al. .................. 257/3 |
| 7,944,053 B2 | 5/2011 | Usui et al. |
| 7,968,506 B2 | 6/2011 | Chou et al. |
| 2011/0183518 A1 | 7/2011 | Usami |

* cited by examiner

SEMICONDUCTOR DEVICE HAVING METAL PLUG AND METHOD OF MANUFACTURING THE SAME

CROSS-REFERENCE TO RELATED APPLICATIONS

This U.S. non-provisional patent application claims priority under 35 U.S.C. §119 of Korean Patent Application No. 10-2012-0090179, filed on Aug. 17, 2012, in the Korean Intellectual Property Office (KIPO), the contents of which are herein incorporated by reference in their entirety.

TECHNICAL FIELD

The present inventive concepts relate to a semiconductor device having a metal plug and a method of manufacturing the same. The semiconductor device comprises a lower metal plug formed on a semiconductor substrate and an upper metal plug electrically connected to the lower metal plug.

BACKGROUND

A semiconductor device may comprise various metal plugs including an upper metal plug and a lower metal plug. A barrier metal layer may be formed between the upper metal plug and the lower metal plug. In order to increase electrical reliability of the semiconductor device, the upper metal plug should be connected to the lower metal plug without the creation of any structural faults, such as a crack in the barrier metal layer.

SUMMARY

The present inventive concepts provide a semiconductor device having a metal plug and a method of manufacturing the same.

In accordance with one aspect of the inventive concepts, a semiconductor device is provided including a first insulating layer on a substrate; a first contact hole passing through the first insulating layer and exposing an upper surface of the substrate; a first barrier metal layer on a sidewall and at a bottom of the first contact hole; a first metal plug on the first barrier metal layer and in the first contact hole; a recess region between the first insulating layer and the first metal plug and defined by an upper surface of the barrier metal layer and sidewalls of the first metal plug and the first insulating layer, the upper surface of the first barrier metal layer being lower than upper surfaces of the first insulating layer and the first metal plug; a gap-fill layer filling the recess region; a second insulating layer on the gap-fill layer; a second contact hole passing through the second insulating layer and exposing the upper surface of the first metal plug, a bottom of the second contact hole overlapping with the recess region; a second barrier metal layer on a sidewall and at the bottom of the second contact hole; and a second metal plug on the second barrier metal layer, the second metal plug filling the second contact hole.

In some embodiments, the gap-fill layer may be extended from the upper surface of the barrier metal layer to the upper surfaces of the first metal plug and the first insulating layer.

In some embodiments, the semiconductor device may further include a first etching stop layer between the gap-fill layer and the second insulating layer.

In some embodiments, the recess region may have tapered sidewalls and an uppermost width of the recess region may be larger than a lowermost width of the recess region.

In some embodiments, the first metal plug may comprise tungsten (W) and the second metal plug may comprise copper (Cu).

In some embodiments, the semiconductor device may further include a tungsten seed layer between the first barrier metal layer and the first metal plug.

In some embodiments, an uppermost surface of the tungsten seed layer may be lower than an uppermost surface of the first barrier metal layer.

In some embodiments, an uppermost surface of the tungsten seed layer may be higher than an uppermost surface of the first barrier metal layer.

In some embodiments, the semiconductor device may further include an air gap in the recess region. The air gap may be surrounded by the gap-fill layer.

In accordance with another aspect of the inventive concepts, provided is a method of manufacturing a semiconductor device which may include forming a first insulating layer on a substrate; forming a first contact hole passing through the first insulating layer and exposing an upper surface of the substrate; forming a first barrier metal layer on a sidewall and at a bottom of the first contact hole; forming a first metal plug on the first barrier metal layer to fill the first contact hole; planarizing the metal plug and the first barrier metal layer until an upper surface of the first insulating layer is exposed; forming a recess region between the first insulating layer and the first metal plug, the recess region being defined by an upper surface of the barrier metal layer and sidewalls of the first metal plug and the first insulating layer, the upper surface of the first barrier metal layer is lower than upper surfaces of the first insulating layer and the first metal plug; forming a gap-fill layer to fill the recess region; forming a second insulating layer on the gap-fill layer; forming a second contact hole passing through the second insulating layer and exposing the upper surface of the first metal plug, a bottom of the second contact hole overlapping with the recess region; forming a second barrier metal layer on a sidewall and at the bottom of the second contact hole; and forming a second metal plug on the second barrier metal layer to fill the second contact hole In some embodiments, the method may further include forming a seed layer on the first barrier metal layer before forming the first metal plug.

In some embodiments, the method may further include enlarging the recess region, before forming the gap-fill layer, using a radio frequency etching process. The radio frequency etching process may be performed by using at least one selected from the group consisting of helium (He), hydrogen (H2), nitrogen trifluoride (NF3), and argon (Ar).

In some embodiments, the method may further include forming a etching stop layer on the second insulating layer; and forming a metal hard mask layer on the etching stop layer, the second contact hole passes through the metal hard mask layer, the etching stop layer, and the second insulating layer.

In some embodiments, the method may further include removing the metal hard mask layer before forming the second barrier metal layer.

In some embodiments, the metal hard mask layer may comprise the same material as the first barrier metal layer such as titanium nitride (TiN).

In accordance with another aspect of the inventive concepts, provided is a semiconductor device including a first insulating layer on a substrate; a first contact hole passing through the first insulating layer and exposing an upper surface of the substrate; and a first contact filling the first contact hole. The first contact includes a first barrier metal layer on a sidewall and at a bottom of the first contact hole; and a first metal plug on the first barrier metal layer and in the first contact hole. The semiconductor device further includes a recess region formed by etching the first barrier metal layer, the recess region being in the first contact hole between the upper surface of the first insulating layer and the upper surface of the first barrier metal layer; a recess region formed by etching the first barrier metal layer, the recess region being in the first contact hole between the upper surface of the first insulating layer and the upper surface of the first barrier metal layer; and a gap-fill layer filling the recess region; a gap-fill layer filling the recess region; a second insulating layer on the gap-fill layer; a second insulating layer on the gap-fill layer; a second contact hole passing through the second insulating layer and exposing a portion of the gap-fill layer and a portion of the first metal plug; and a second contact filling the second contact hole.

In some embodiments, the second contact includes a second barrier metal layer on a sidewall and at the bottom of the second contact hole, and a second metal plug on the second barrier metal layer, the second metal plug filling the second contact hole.

In some embodiments, the gap-fill layer is extended from the upper surface of the first barrier metal layer to the upper surfaces of the first metal plug and the first insulating layer.

In some embodiments, the semiconductor device further includes a first etching stop layer between the gap-fill layer and the second insulating layer; a second etching stop layer on the second insulating layer; and a metal hard mask layer on the second etching stop layer. The second contact hole passes through the metal hard mask layer, the second etching stop layer, the second insulating layer and the first etching stop layer.

In some embodiments, the semiconductor device further includes an air gap disposed in the gap-fill layer, wherein the air gap is surrounded by the gap-fill layer.

BRIEF DESCRIPTION OF THE DRAWINGS

The foregoing and other features and advantages of the inventive concepts will be apparent from the more particular description of embodiments of the inventive concepts, as illustrated in the accompanying drawings in which like reference characters refer to the same parts throughout the different views. The drawings are not necessarily to scale, emphasis instead being placed upon illustrating the principles of the inventive concepts.

DETAILED DESCRIPTION OF THE EMBODIMENT

Figure 1:
FIGS. 1 through 8 are cross-sectional views illustrating a method of manufacturing a semiconductor device according to an example embodiment of the inventive concepts.

Various example embodiments of the inventive concepts will be described more fully hereinafter with reference to the accompanying drawings, in which some example embodiments are shown. The present inventive concept may, however, be embodied in many different forms and should not be construed as limited to the example embodiments set forth herein.

It will also be understood that when a layer or element is referred to as being "on," "connected to" or "coupled to" another layer or element, it can be directly on, connected or coupled to the other layer or element, or intervening layers or elements may also be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed elements.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concepts.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary charge from implanted to non-implanted region. Likewise, a buried region formed by implantation may result in some implantation in the region between the buried region and the surface through with the implantation takes place. Thus, the regions illustrated in the figures are schematic in nature and their shapes are not intended to illustrate the actual shape of a region of a decide and are not intended to limit the scope of the present inventive concepts.

Hereinafter, example embodiments of the inventive concepts will be described in detail with reference to the accompanying drawings.

Referring to FIG. 1, a substrate 10 is provided. The substrate 10 may include a rigid substrate such as a bulk silicon substrate or a silicon-on-insulator (SOI) substrate. A first insulating layer 12 may be disposed on the substrate 10. The first insulating layer 12 may comprise of a silicon dioxide.

Figure 2:
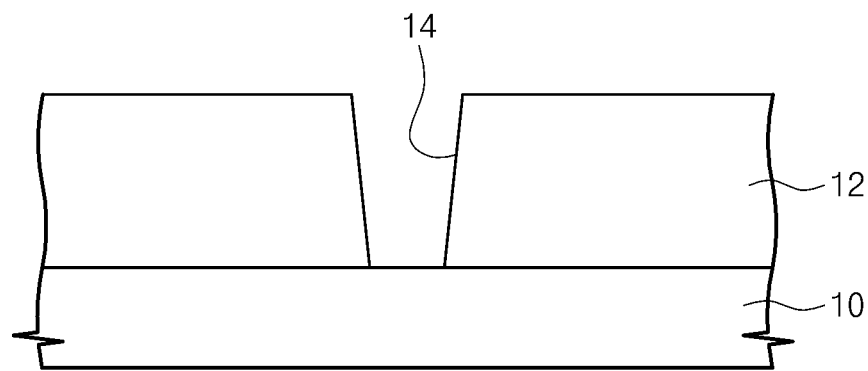

Referring to FIG. 2, a first contact hole 14 may be formed in the first insulating layer 12. The first contact hole 14 may be disposed in the first insulating layer 12 and may expose an upper surface of the substrate 10. The first contact hole 14 may have various shapes such as a circular shape, an elliptical shape, a linear shape, or a bended linear shape.

Figure 3:
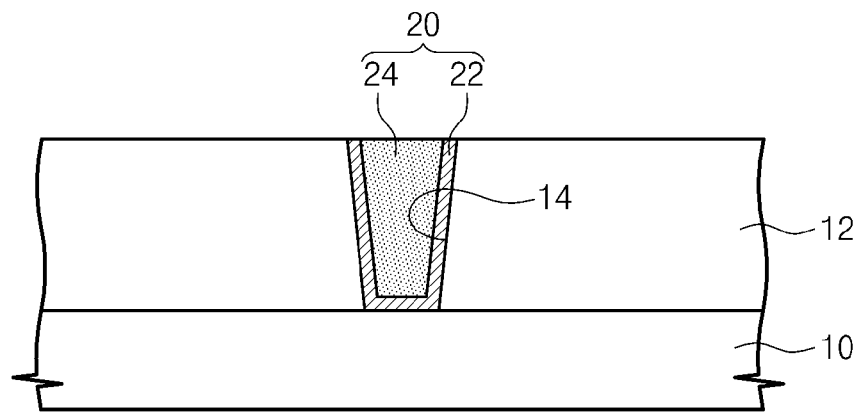

Referring to FIG. 3, a first barrier metal layer 22 may be formed on sidewalls of the first contact hole 14 and at a bottom of the first contact hole 14. The first barrier metal layer 22 may be formed along the sidewalls of the first insulating layer 12 in the first contact hole 14. The first barrier metal layer 22 may comprise at least one selected from the group consisting of titanium (Ti), titanium nitride (TiN), or a mixture of them. A first metal plug 24 may be formed on the first barrier metal layer 22 to fill the first contact hole 14. The first metal plug 24 may comprise, for example, tungsten (W). A CMP (Chemical Mechanical Polishing) process may be performed after filling the first contact hole 14 with the first metal plug 24 until an upper surface of the first insulating layer 12 is exposed. Therefore, a first contact 20, including the first barrier metal layer 22 and the first metal plug 24, may be formed.

Figure 4:
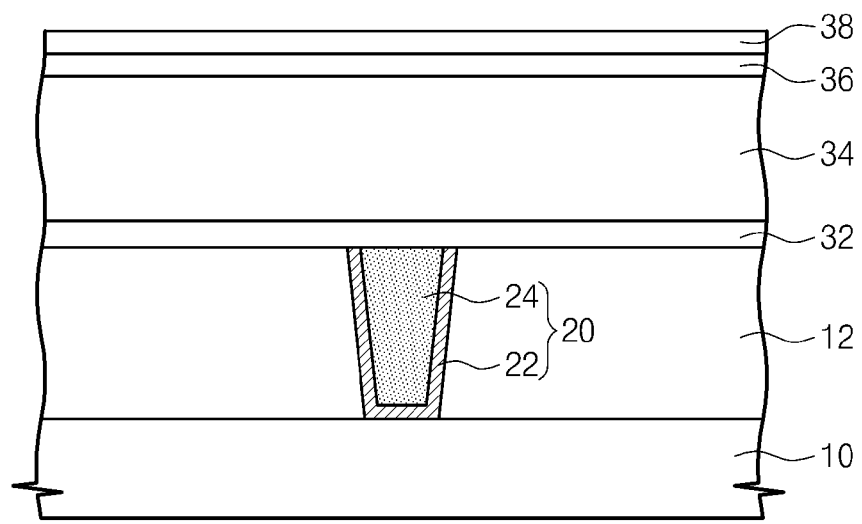

Referring to FIG. 4, a second insulating layer 34 may be formed on the first insulating layer 12 and the first contact 20. The second insulating layer 34 may comprise, for example, a silicon dioxide. In some embodiments, a first etching stop layer 32 may be formed on the first insulating layer 12 and the first contact 20 before forming the second insulating layer 34. The first etching stop layer 32 may comprise, for example, a silicon nitride.

A second etching stop layer 36 may be formed on the second insulating layer 34. The second etching stop layer 36 may comprise, for example, a silicon nitride or a silicon oxynitride. A metal hard mask layer 38 may be formed on the second etching stop layer 36. The metal hard mask layer 38 may comprise, for example, a titanium nitride.

Figure 5:
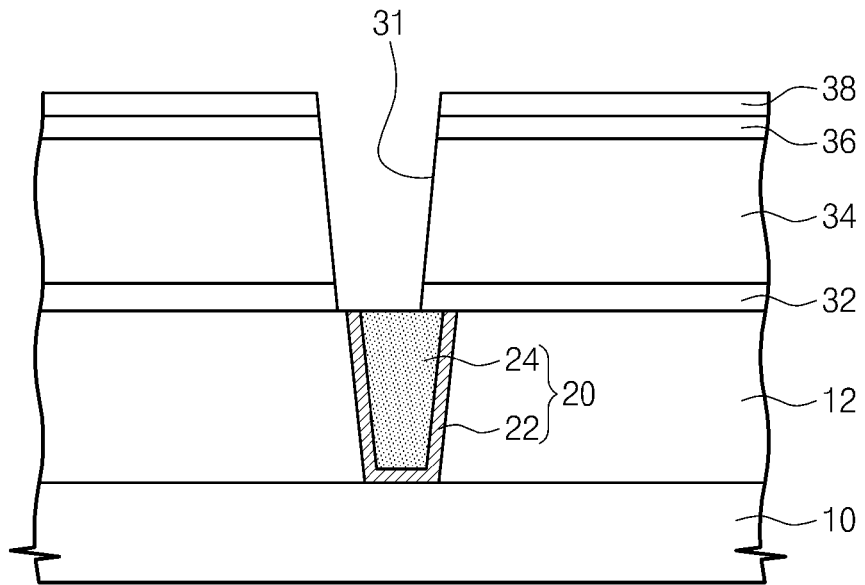

Referring to FIG. 5, a second contact hole 31 may be formed passing through the second insulating layer 34. The second contact hole 31 may be formed through the metal hard mask layer 38, the second etching stop layer 36, the second insulating layer 34 and the first etching stop layer 32. The second contact hole 31 exposes portions of upper surfaces of the first barrier metal layer 22 and the first metal plug 24. The second contact hole 31 may be formed using, for example, a dry etching process. The second contact hole 31 may have various shapes such as a circular shape, an elliptical shape, a linear shape, or a bended linear shape.

Figure 6:
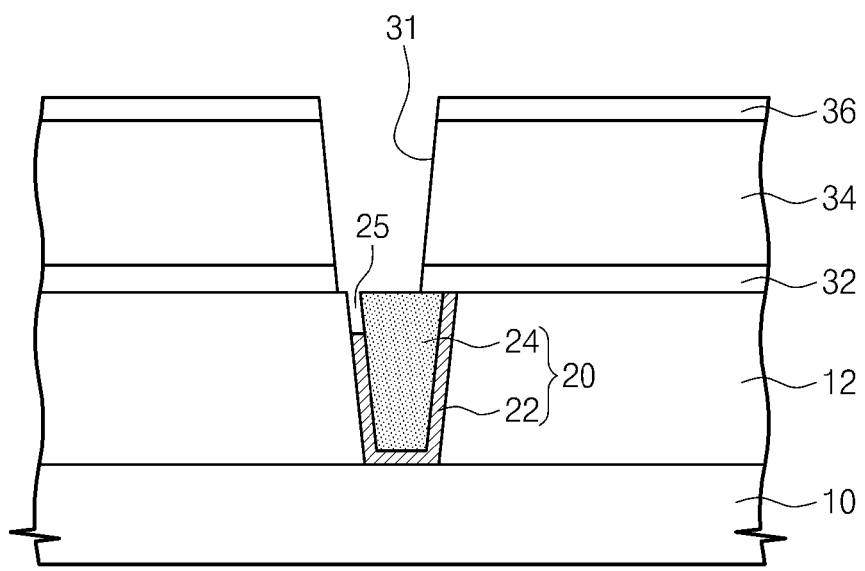

Referring to FIG. 6, the metal hard mask layer 38 may be removed. The metal hard mask layer 38 may be removed by a dry etching process or a wet etching process. In order to effectively reduce an aspect ratio of the second contact hole 31 and in order to effectively fill the second contact hole 31 with a second metal plug 44 (referring to FIG. 7) without air gaps in the second contact hole 31, the metal hard mask layer 38 may be removed before forming the second metal plug 44. The second metal plug 44 may be formed by a CVD (Chemical Vapor Deposition) process.

When the metal hard mask 38 is removed, the first barrier metal layer 22 which is exposed at a bottom of the second contact hole 31 may be partially etched and a first recess region 25 may be formed between the first insulating layer 12 and the first metal plug 24. If material of the first barrier metal layer 22 is similar or same as the metal hard mask layer 38, the first barrier metal layer 22 may be easily etched while the metal hard mask layer 38 is removed.

Figure 7:
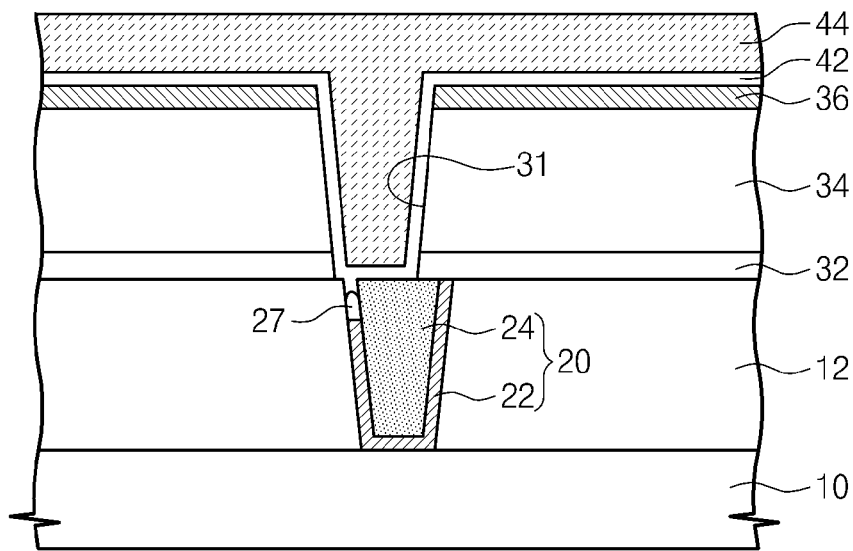

Referring to FIG. 7, a second barrier metal layer 42 may be formed on sidewalls of the second contact hole 31 and at a bottom of the second contact hole 31. The second barrier metal layer 42 may be formed along the sidewalls of the second insulating layer 32 in the second contact hole 31. The second barrier layer 42 may comprise at least one selected from the group consisting of tantalum (Ta), tantalum nitride (TaN), or a combination thereof. While forming the second barrier layer 42, an air gap 27 may be formed in the first recess region 25.

A second metal plug 44 may be formed on the second barrier metal layer 42 to fill the second contact hole 31. The second metal plug 44 may comprise, for example, copper (Cu).

Figure 8:
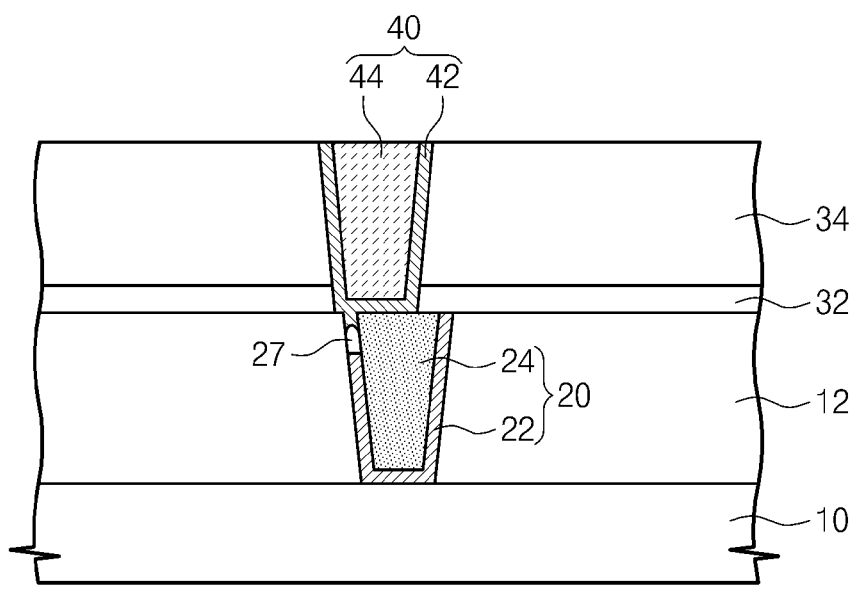

Referring to FIG. 8, the second barrier metal layer 42 and the second metal plug 44 may be planarized. A CMP (Chemical Mechanical Polishing) process may be used for planarization of the second barrier metal layer 42 and the second metal plug 44. A second contact 40 may be formed after the planarization of the second barrier metal layer 42 and the second metal plug 44. The second contact 40 may include the second barrier metal layer 42 and the second metal plug 44. In some example embodiments, the second etching stop layer 36 may be used as a CMP stop layer and may be removed after the CMP process.

FIG. 9 through FIG. 21 are cross-sectional views illustrating a method of manufacturing a semiconductor device according to another example embodiment of the inventive concepts.

Figure 9:
FIGS. 9 through 21 are cross-sectional views illustrating a method of manufacturing a semiconductor device according to another example embodiment of the inventive concepts.

Referring to FIG. 9, a substrate 10 is provided. The substrate 10 may comprise a rigid substrate such as, for example, a bulk silicon substrate, a silicon-on-insulator (SOI) substrate, a gallium arsenide substrate, a silicon germanium substrate, a ceramic substrate, a quartz substrate, a glass substrate for display, or a flexible plastic substrate such as a polyethylene terephthalate, a polymethylmethacrylate, a polyimide, polycarbonate, a polyethersulfone, or a polyethylene naphthalate. A first insulating layer 12 may be formed on the substrate 10. The first insulating layer 12 may comprise a silicon dioxide deposited by a HDP (High Density Plasma) process or a FCVD (Flowable Chemical Vapor Deposition) process.

Figure 10:
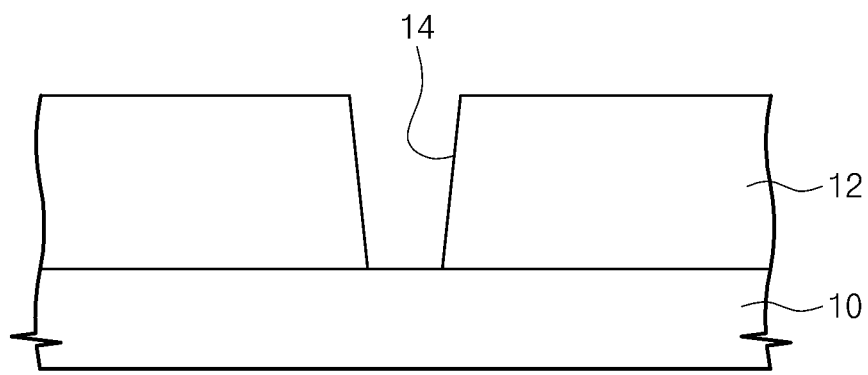

Referring to FIG. 10, a first contact hole 14 may be formed in the first insulating layer 12. The first contact hole 14 may be formed through the first insulating layer 12 and may expose an upper surface of the substrate 10. The first contact hole 14 may be formed using a dry etching process. The first contact hole 14 may have various shapes such as a circular shape, an elliptical shape, a linear shape, or a bended linear shape.

Figure 11:
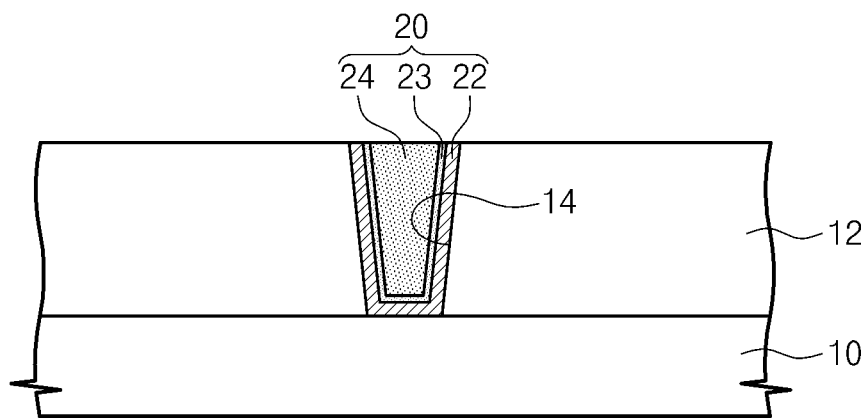

Referring to FIG. 11, a first barrier metal layer 22 may be formed on sidewalls of the first contact hole 14 and at a bottom of the first contact hole 14. The first barrier metal layer 22 may be formed along the sidewalls of the first insulating layer 12 in the first contact hole 14. The first barrier metal layer 22 may comprise at least one selected from the group consisting of titanium (Ti), titanium nitride (TiN), or a combination thereof. The first metal plug 24 may be formed on the first barrier metal layer 22 to fill the first contact hole 14. The first metal plug 24 may comprise tungsten (W). A seed layer 23 may be formed on the first barrier metal layer 22 before forming the first metal plug 24. The seed layer 23 may comprise tungsten (W). A CMP (Chemical Mechanical Polishing) process may be performed after filling the first contact hole 14 with the first metal plug 24 until an upper surface of the first insulating layer 12 is exposed. Therefore, a first contact 20, including the first barrier metal layer 22, the seed layer 23, and the first metal plug 24, may be formed.

Figure 12:
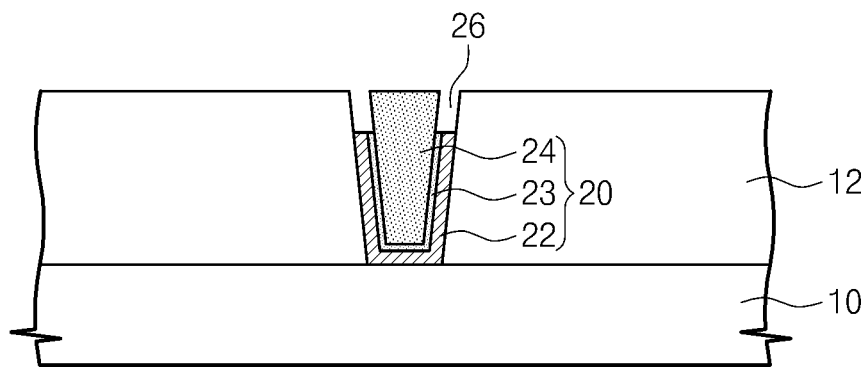

Referring to FIG. 12, a second recess region 26 may be formed between the first insulating layer 12 and the first metal plug 24. The second recess region 26 may be formed by partially etching an upper portion of the first barrier metal layer 22 and the seed layer 23. The second recess region 26 may be formed using a dry etching process or a wet etching process. A depth of the second recess region 26 may be approximately 50 to 60 Å; however the depth of the second recess region is not limited thereto. The recess region may be defined by an upper surface of the first barrier metal layer 22 and sidewalls of the first metal plug 24 and the first insulating layer 12. The upper surface of the first barrier metal layer 22 may be lower than upper surfaces of the first insulating layer 12 and the first metal plug 24.

If a dry etching process is used in forming the second recess region 26, at least one selected from the group consisting of sulfur hexafluoride (SF6), boron trichloride (BCl3), ozone (O3), chlorine (Cl2), carbon tetrafluoride (CF4), or argon (Ar) may be used. If a wet etching process is used in forming the second recess region 26, sulfuric acid (H2SO4), hydrogen peroxide (H2O2), water (H2O), or a combination thereof may be used.

Figure 13A:
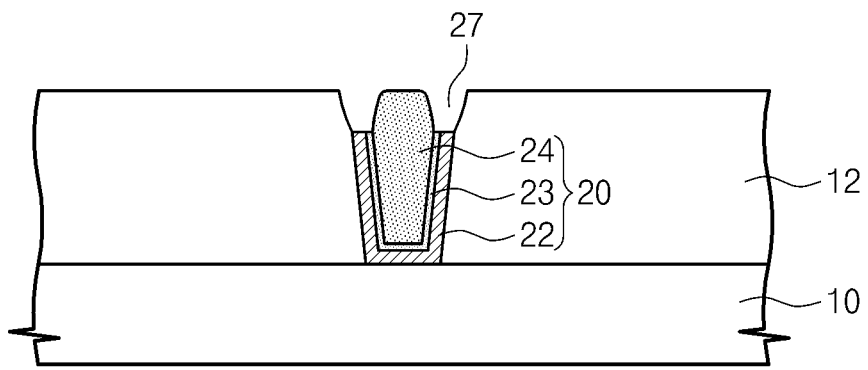

Furthermore, referring to FIG. 13A, an expanded recess region 27 may be formed by additionally etching the second recess region 26. As a result of the additional etching of the second recess region 26, sidewalls of the first insulating layer 12 adjacent to the expanded recess region 27 may be tapered.

For example, referring to FIG. 13A, a depth and a width of the expanded recess region 27 may be deeper and wider, respectively, than those of the second recess region 26. The expanded recess region 27 is formed in order to more easily deposit a gap-fill layer therein in a later step. The expanded recess region 27 may be formed by a RF (Radio Frequency) etch process using at least one selected from the group consisting of sulfur hexafluoride (SF6), boron trichloride (BCl3), ozone (O3), chlorine (Cl2), carbon tetrafluoride (CF4), or argon (Ar).

Figure 13B:
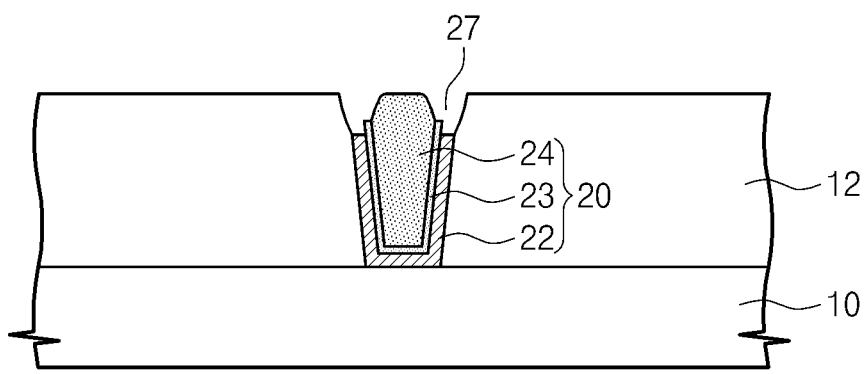
Figure 13C:
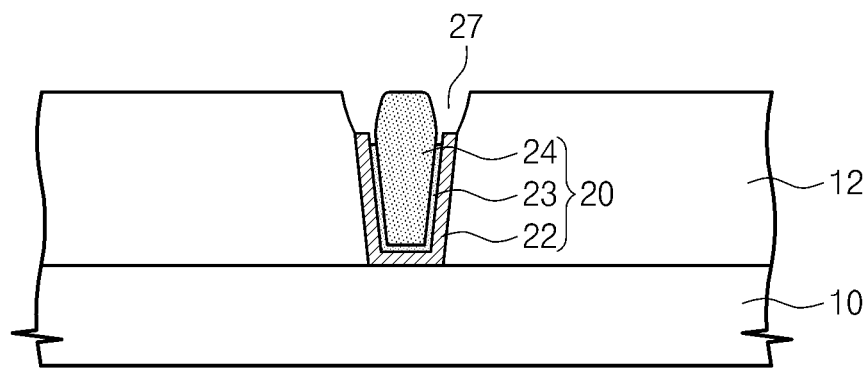

In another example embodiment, referring to FIG. 13B and FIG. 13C, an uppermost portion of the seed layer 23 may be higher, as illustrated in FIG. 13B, or lower than, as illustrated in FIG. 13C, an uppermost portion of the first barrier metal layer 22 at the expanded recess region 27.

Figure 13D:
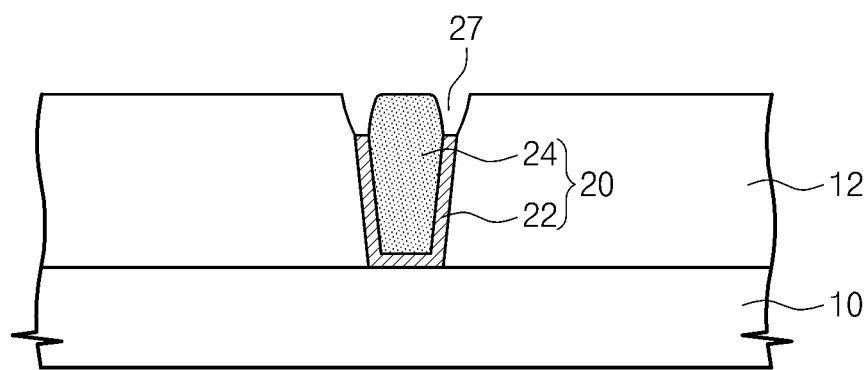

In another example embodiment, FIG. 13D illustrates the expanded recess region 27 including the first contact 20 in which a seed layer is not formed.

Figure 14:
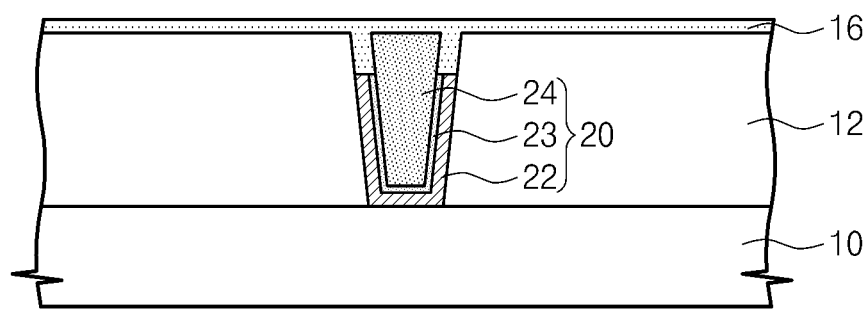

Referring to FIG. 14, a gap-fill layer 16 may be formed on the first insulating layer 12 to fill the second recess region 26. The gap-fill layer 16 may comprise silicon carbide (SiC), silicon carbon nitride (SiCN), or silicon nitride (Si3N4). The gap-fill layer 16 may be formed using a CVD (Chemical Vapor Deposition) process or an ALD (Atomic Layer Deposition) process.

Figure 15:
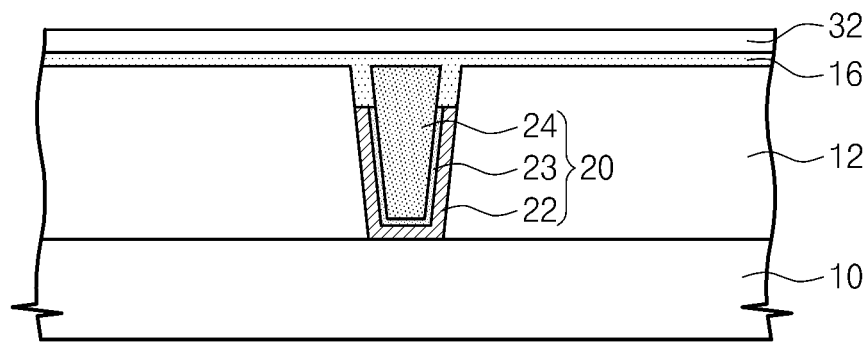

Referring to FIG. 15, a first etching stop layer 32 may be formed on the gap-fill layer 16. The first etching stop layer 32 may comprise silicon carbide (SiC), silicon carbon nitride (SiCN), or silicon nitride (Si3N4). The first etching stop layer 32 may be formed using a CVD (Chemical Vapor Deposition) process.

Figure 16:
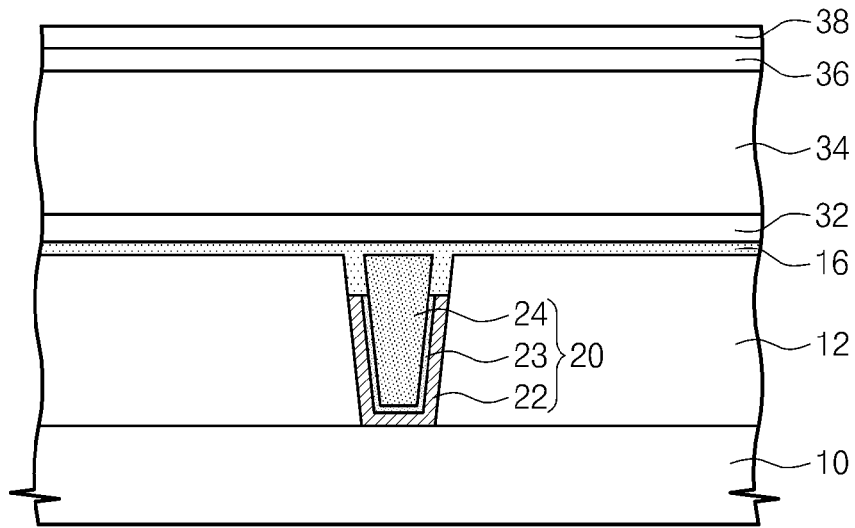

Referring to FIG. 16, a second insulating layer 34 may be formed on the first etching stop layer 32. The second insulating layer 34 may comprise a silicon dioxide (SiO2) having a low-k or ultra low-k dielectric constant. In general, a dielectric layer having a dielectric constant of 2.5 to 3.0 is referred to as a low-k dielectric layer and a dielectric layer having a dielectric constant of below 2.5 is referred to as an ultra low-k dielectric layer. Several silicon dioxide layers, for example, a silicon oxycarbide (SiOC), a silicon oxyfluoride (SiOF), and a hydrogen-containing silicon oxycarbide (SiOCH) are well known as low-k dielectric layers and porous hydrogen-containing silicon oxycarbide is well known as an ultra low-k dielectric layer.

Referring to FIG. 16, a second etching stop layer 36 may be formed on the second insulating layer 34. The second etching stop layer 36 may comprise a silicon carbide (SiC) layer, a silicon carbon nitride (SiCN) layer, or a silicon nitride (Si3N4) layer. The second etching stop layer 36 may be formed using a CVD (Chemical Vapor Deposition) process.

A metal hard mask layer 38 may be formed on the second etching stop layer 36. The second etching stop layer may comprise a titanium nitride (TiN) layer.

Figure 17:
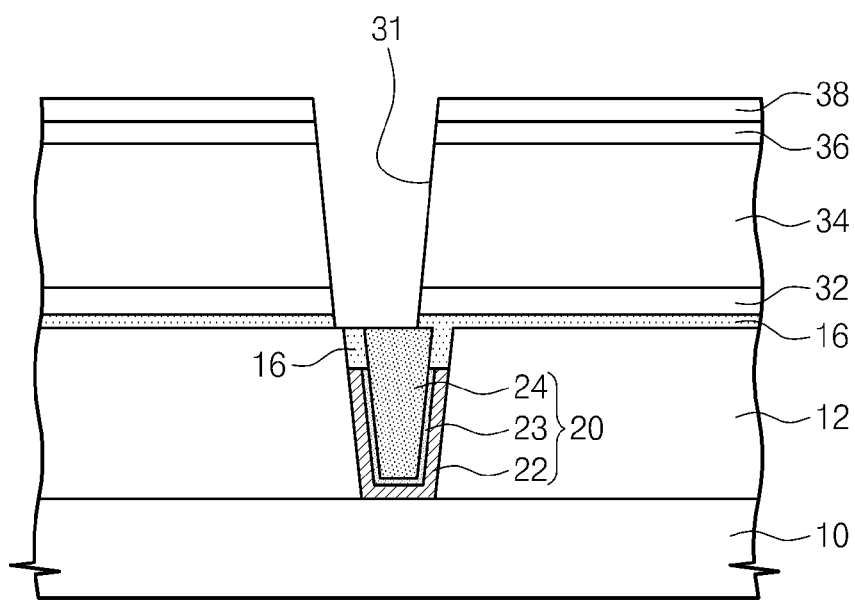

Referring to FIG. 17, a second contact hole 31 may be formed in the second insulating layer 34. The second contact hole 31 may be formed by passing through the metal hard mask layer 38, the second etching stop layer 36, the second insulating layer 34, the first etching stop layer 32, and portions of the gap-filling layer 16, and exposing portions of an upper surface of the first metal plug 24 and portions of an upper surface of the gap-fill layer filling the second recess region 26. A bottom of the second contact hole 31 may overlap with the second recess region 26. The second contact hole 31 may have various shapes such as a circular shape, an elliptical shape, a linear shape, or a bended linear shape.

Figure 18:
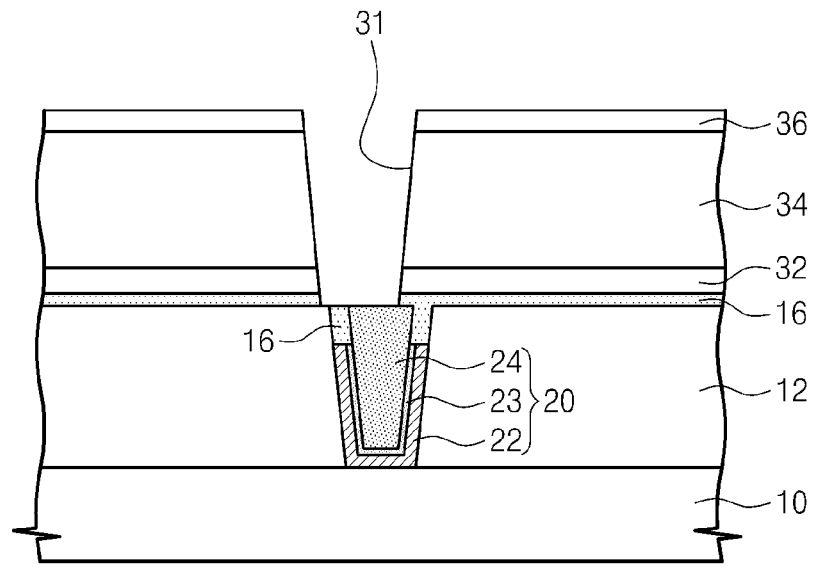

Referring to FIG. 18, after forming the second contact hole 31, the metal hard mask layer 38 may be removed. The metal hard mask layer 38 may be removed using a dry etching process or a wet etching process. When the metal hard mask layer 38 is removed, the first barrier metal layer 22 may be protected from being simultaneously etched because the gap-fill layer 16 is formed on the first barrier metal layer 22 and fills in the second recess region 26.

Figure 19:
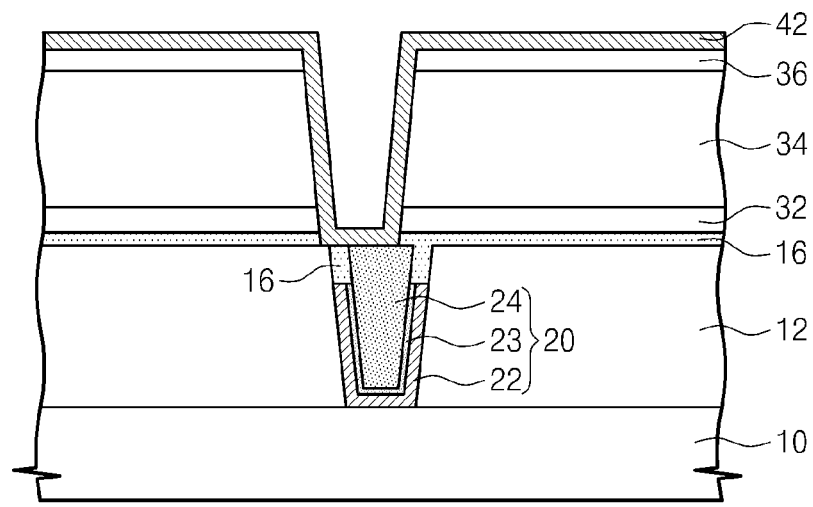

Referring to FIG. 19, a second barrier metal layer 42 may be formed on sidewalls of the second contact hole 31 and at the bottom of the second contact hole 31. The second barrier metal layer 42 may be formed along the sidewalls of the second insulating layer 32 in the second contact hole 31. The second barrier metal layer 42 may comprise at least one selected from the group consisting of tantalum (Ta), tantalum nitride (TaN), or a combination thereof.

According to this example embodiment of the inventive concepts, the second barrier metal layer 42 may be deposited stably and cracking of the second barrier metal layer 42 at the bottom portion of the second contact hole 31 may be substantially prevented. Therefore, reliability of the semiconductor device may be increased.

Figure 20:
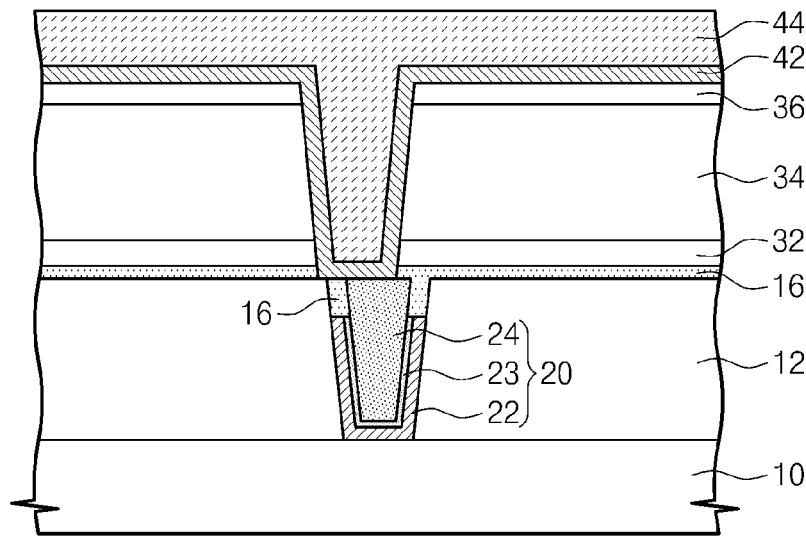

Referring to FIG. 20, a second metal plug 44 may be formed on the second barrier metal layer 42 to fill the second contact hole 31. The second metal plug 44 may comprise copper (Cu).

Figure 21:
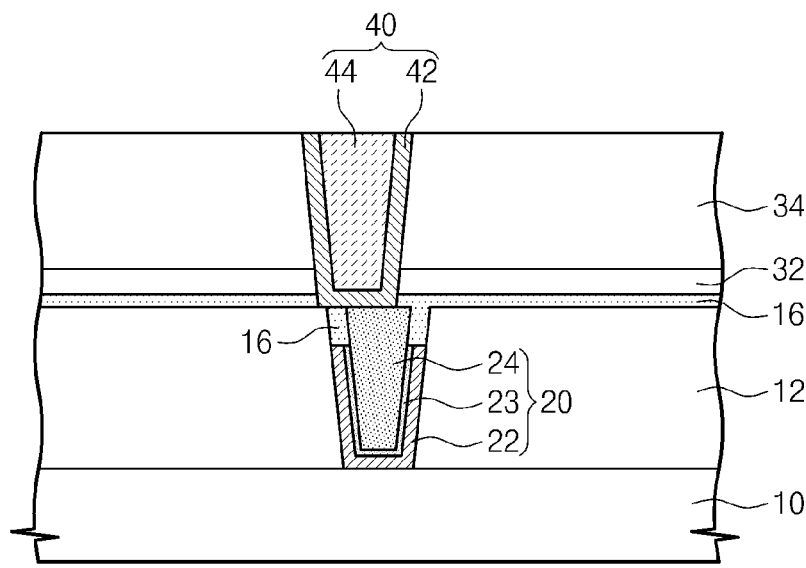

Referring to FIG. 21, the second barrier metal layer 42 and the second metal plug 44 may be planarized. A CMP (Chemical Mechanical Polishing) process may be used for planarization of the second barrier metal layer 42 and the second metal plug 44. A second contact 40 may be formed after the planarization of the second barrier metal layer 42 and the second metal plug 44. The second contact 40 may include the second barrier metal layer 42 and the second metal plug 44. The second etching stop layer 36 may be used as a CMP stop layer and may be removed after the CMP process.

Referring to FIGS. 22 through 25, another example embodiment of the inventive concepts is illustrated. FIGS. 22 through 25 are cross-sectional views illustrating a method of manufacturing a semiconductor device according to another example embodiment of the inventive concepts. The explanations already given referring to FIGS. 9 through 21 and overlapping technical features are omitted. Differences between the example embodiments will be described in detail.

Figure 22:
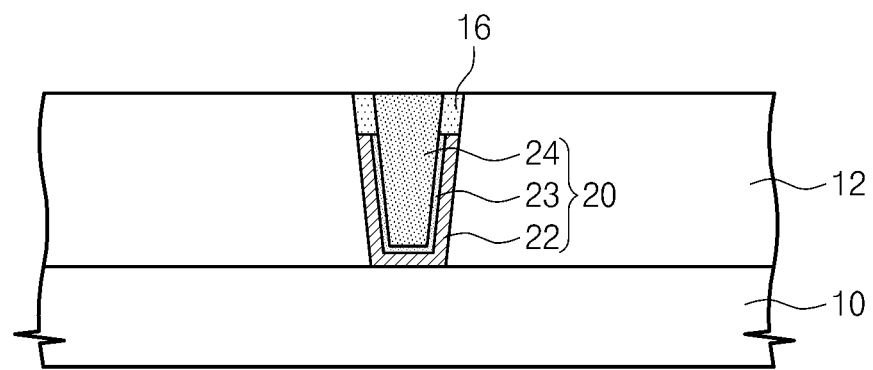
FIGS. 22 through 25 are cross-sectional views illustrating a method of manufacturing a semiconductor device according to another example embodiment of the inventive concepts.

Referring to FIG. 22, the gap-fill layer 16 as shown FIG. 14 may be partially removed by using a planarization process. A portion of the gap-fill layer 16 filling the second recess region 26 remains after the planarization process. The planarization process may be a CMP (Chemical Mechanical Polishing) process or an etch-back process.

Figure 23:
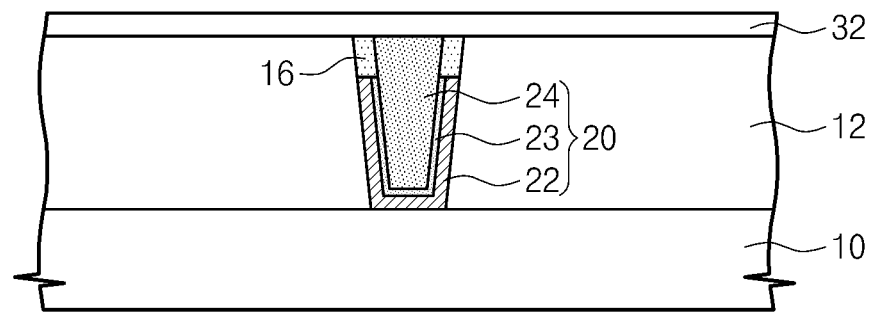
Figure 24:
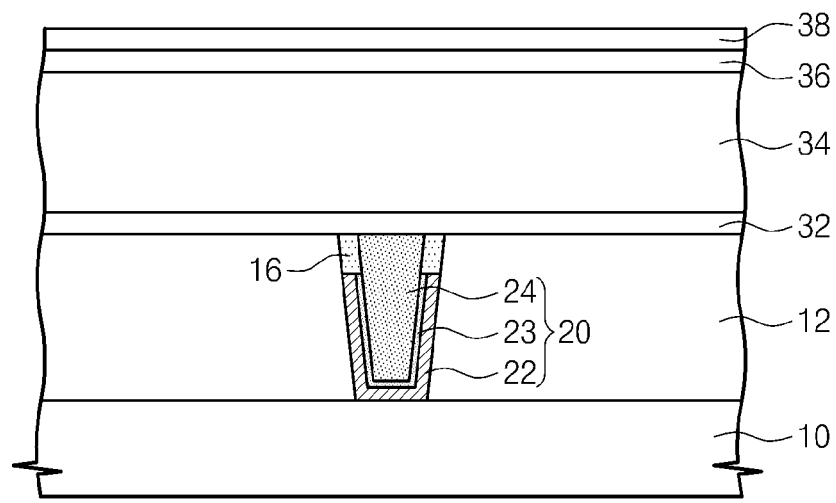
Figure 25:
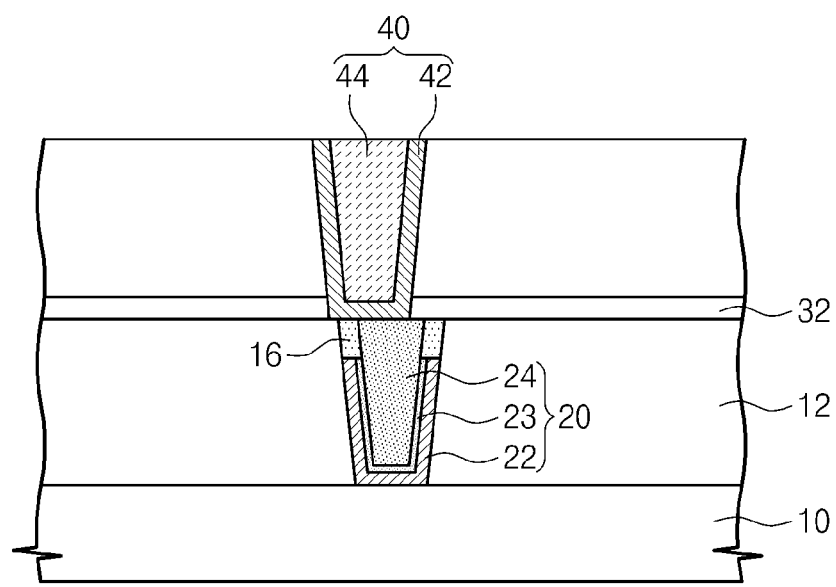

Then, referring to FIGS. 23 through 25, a second contact 40 including a second barrier metal layer 42 and a second metal plug 44 may be formed as mentioned above referring to FIGS. 15 through 21.

Referring to FIGS. 26 through 29, another example embodiment of the inventive concepts is illustrated. FIGS. 26 through 29 are cross-sectional views illustrating a method of manufacturing a semiconductor device according to another example embodiment of the inventive concepts. The explanations already given referring to FIGS. 9 through 21 and overlapping technical features are omitted. Differences between the example embodiments will be described in detail.

Figure 26:
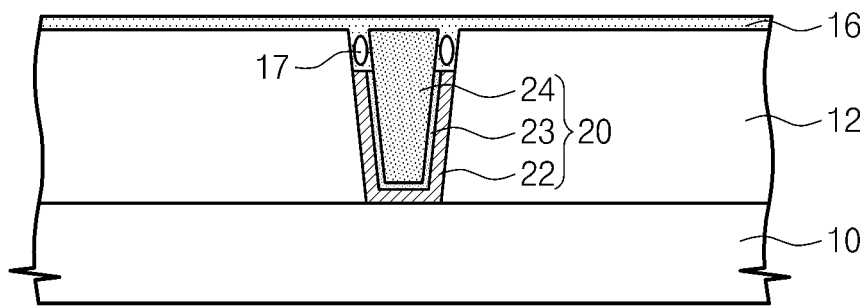
FIGS. 26 through 29 are cross-sectional views illustrating a method of manufacturing a semiconductor device according to another example embodiment of the inventive concepts.

Referring to FIG. 26, an air gap 17 may be formed in the gap-fill layer 16. The gap-fill layer 16 may be extended to the first insulating layer 12 such that the gap-fill layer 16 entirely surrounds the air gap 17.

Figure 27:
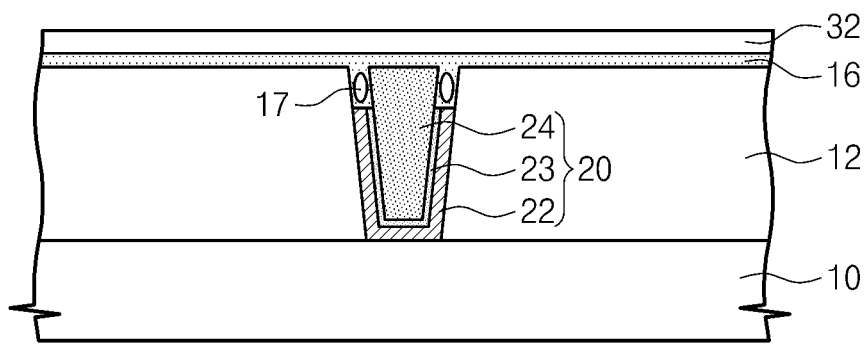
Figure 28:
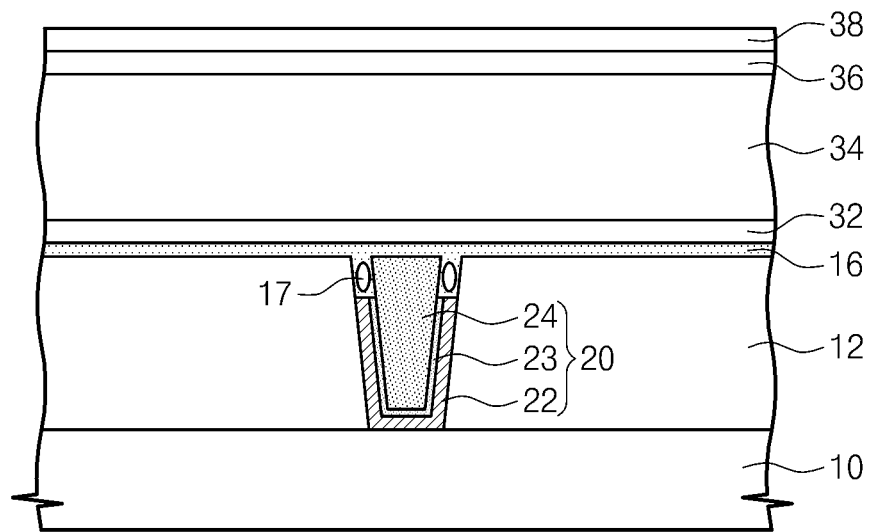
Figure 29:
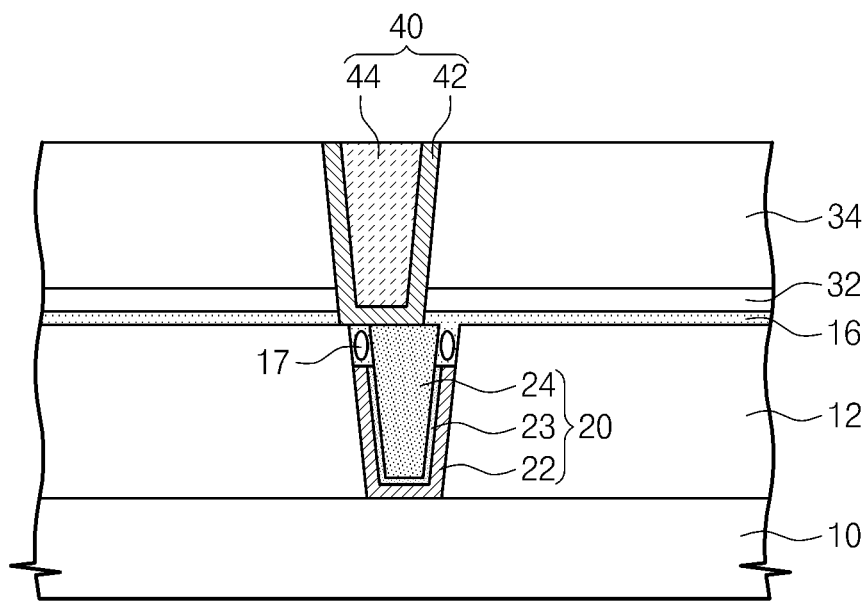

Then, referring to FIGS. 27 through 29, a second contact 40 including a second barrier metal layer 42 and a second metal plug 44 may be formed as mentioned above referring to FIG. 15 through FIG. 21. Because the air gap 17 may be entirely surrounded by the gap-fill layer 16, reliability of the semiconductor device may be increased by protecting the semiconductor device from being formed with any structural defects in the second recess region 26.

Figure 30:
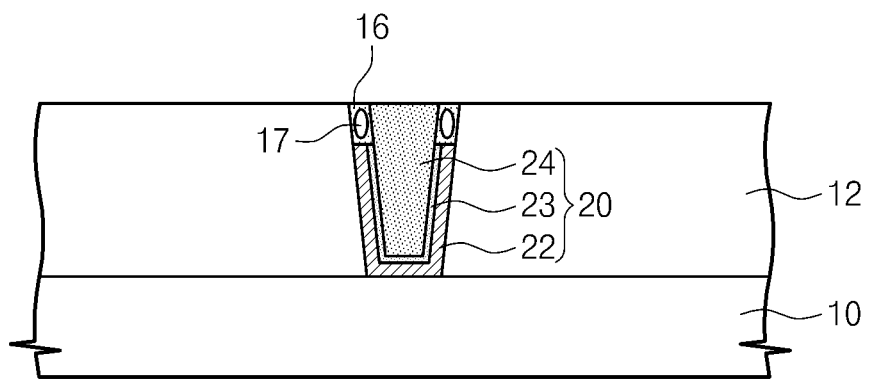
FIGS. 30 through 33 are cross-sectional views illustrating a method of manufacturing a semiconductor device according to another example embodiment of the inventive concepts.
Figure 31:
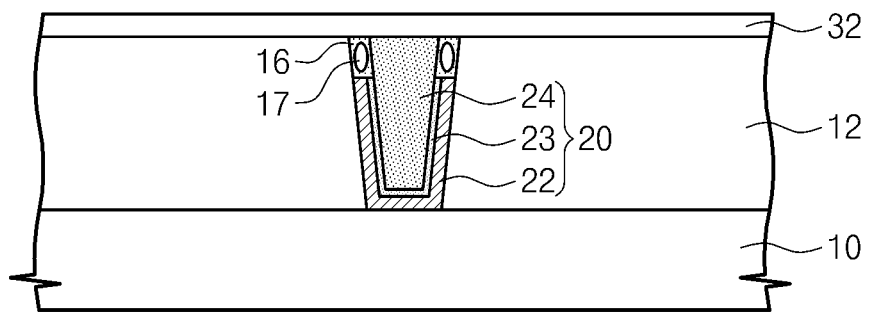
Figure 32:
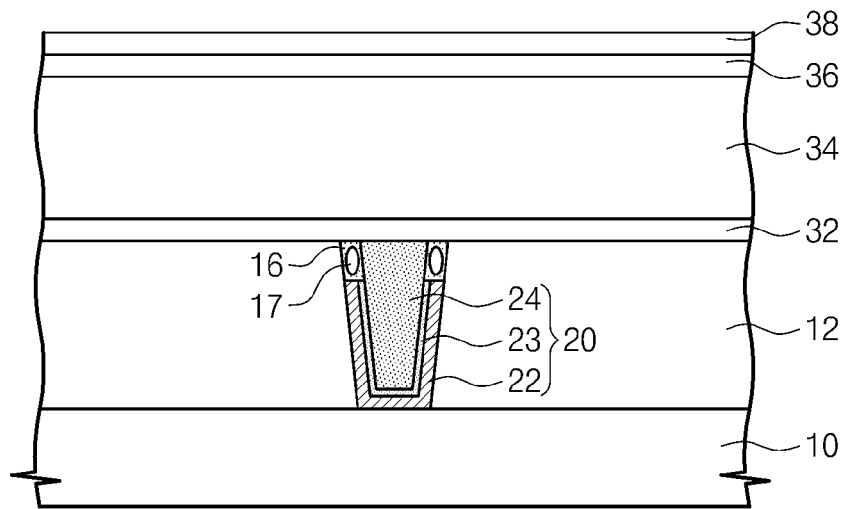
Figure 33:
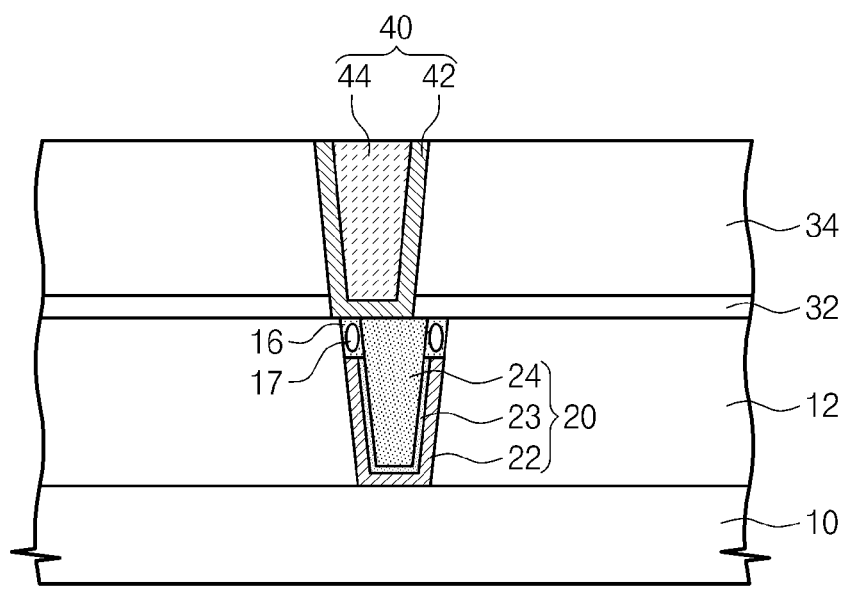

Referring to FIGS. 30 through 32, another example embodiment of the inventive concepts is illustrated. FIGS. 30 through 32 are cross-sectional views illustrating a method of manufacturing a semiconductor device according to another example embodiment of the inventive concepts. The explanations already given referring to FIGS. 9 through 21 and overlapping technical features are omitted. Differences between the example embodiments will be described in detail.

Referring to FIG. 30, the gap-fill layer 16 as shown FIG. 26 having an air gap 17 therein may be partially removed by using a planarization. A portion of the gap-fill layer 16 filling the second recess region 26 remains after the planarization process. The planarization process may be a CMP (Chemical Mechanical Polishing) process or an etch-back process.

Referring to FIGS. 31 and 32, a second contact 40 including a second barrier metal layer 42 and a second metal plug 44 may be formed as mentioned above referring to FIGS. 15 through 21. Because the air gap 17 may be entirely surrounded by the gap-fill layer 16, reliability of the semiconductor device may be increased by protecting the semiconductor device from being formed with any structural defects in the second recess region 26.

The foregoing is illustrative of example embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this inventive concepts as defined in the claims. In the claims, means-plus-function clauses are intended to cover the structures described herein as performing the recited function, and not only structural equivalents but also equivalent structures.

What is claimed is:

1. A semiconductor device, comprising:
a first insulating layer on a substrate;
a first contact hole passing through the first insulating layer and exposing an upper surface of the substrate;
a first barrier metal layer on a sidewall and at a bottom of the first contact hole;
a first metal plug on the first barrier metal layer and in the first contact hole;
a recess region between the first insulating layer and the first metal plug, the recess region defined by an upper surface of the barrier metal layer and sidewalls of the first metal plug and the first insulating layer, the upper surface of the first barrier metal layer being lower than upper surfaces of the first insulating layer and the first metal plug;
a gap-fill layer filling the recess region;
a second insulating layer on the gap-fill layer;
a second contact hole passing through the second insulating layer and exposing the upper surface of the first metal plug, a bottom of the second contact hole overlapping with the recess region;
a second barrier metal layer on a sidewall and at the bottom of the second contact hole; and
a second metal plug on the second barrier metal layer, the second metal plug filling the second contact hole.

2. The semiconductor as claimed in claim 1, wherein the gap-fill layer is extended from the upper surface of the first barrier metal layer to the upper surfaces of the first metal plug and the first insulating layer.

3. The semiconductor as claimed in claim1, further comprising:
a first etching stop layer between the gap-fill layer and the second insulating layer.

4. The semiconductor as claimed in claim 1, wherein the recess region has tapered sidewalls and an uppermost width of the recess region is larger than a lowermost width of the recess region.

5. The semiconductor as claimed in claim 1, wherein the first metal plug comprises tungsten (W) and the second metal plug comprises copper (Cu).

6. The semiconductor as claimed in claim 4, further comprising:
a tungsten seed layer between the first barrier metal layer and the first metal plug.

7. The semiconductor as claimed in claim 6, wherein an uppermost surface of the tungsten seed layer is higher than an uppermost surface of the first barrier metal layer.

8. The semiconductor as claimed in claim 6, wherein an uppermost surface of the tungsten seed layer is lower than an uppermost surface of the first barrier metal layer.

9. The semiconductor as claimed in claim 1, further comprising:
an air gap disposed in the gap-fill layer.

10. A method of manufacturing a semiconductor device, the method comprising:
- forming a first insulating layer on a substrate;
- forming a first contact hole passing through the first insulating layer and exposing an upper surface of the substrate;
- forming a first barrier metal layer on a sidewall and at a bottom of the first contact hole;
- forming a first metal plug on the first barrier metal layer to fill the first contact hole;
- planarizing the metal plug and the first barrier metal layer until an upper surface of the first insulating layer is exposed;
- forming a recess region between the first insulating layer and the first metal plug, the recess region being defined by an upper surface of the barrier metal layer and sidewalls of the first metal plug and the first insulating layer, the upper surface of the first barrier metal layer is lower than upper surfaces of the first insulating layer and the first metal plug;
- forming a gap-fill layer to fill the recess region;
- forming a second insulating layer on the gap-fill layer;
- forming a second contact hole passing through the second insulating layer and exposing the upper surface of the first metal plug, a bottom of the second contact hole overlapping with the recess region;
- forming a second barrier metal layer on a sidewall and at the bottom of the second contact hole; and
- forming a second metal plug on the second barrier metal layer to fill the second contact hole.

11. The method as claimed in claim 10, further comprising:
- foaming a seed layer on the first barrier metal layer before forming the first metal plug.

12. The method as claimed in claim 10, further comprising:
- enlarging the recess region using a radio frequency etching process before forming the gap-fill layer; and
- wherein the radio frequency etching process is performed by using at least one selected from the group consisting of helium (He), hydrogen (H2), nitrogen trifluoride (NF3), and argon (Ar).

13. The method as claimed in claim 10, further comprising:
- forming a second etching stop layer on the second insulating layer;
- forming a metal hard mask layer on the second etching stop layer; and
- wherein the second contact hole passes through the metal hard mask layer, the second etching stop layer, and the second insulating layer.

14. The method as claimed in claim 13, further comprising:
- removing the metal hard mask layer before forming the second barrier metal layer.

15. The method as claimed in claim 13, wherein the metal hard mask layer comprises the same material with the first barrier metal layer.

16. A semiconductor device, comprising:
- a first insulating layer on a substrate;
- a first contact hole passing through the first insulating layer and exposing an upper surface of the substrate;
- a first contact filling the first contact hole, comprising:
  - a first barrier metal layer on a sidewall and at a bottom of the first contact hole; and
  - a first metal plug on the first barrier metal layer and in the first contact hole;
- a recess region formed by etching the first barrier metal layer, the recess region being in the first contact hole between the upper surface of the first insulating layer and the upper surface of the first barrier metal layer;
- a gap-fill layer filling the recess region;
- a second insulating layer on the gap-fill layer;
- a second contact hole passing through the second insulating layer and exposing a portion of the gap-fill layer, and exposing a portion of the first metal plug; and
- a second contact filling the second contact hole.

17. The semiconductor as claimed in claim 16, wherein the second contact comprises:
- a second barrier metal layer on a sidewall and at the bottom of the second contact hole; and
- a second metal plug on the second barrier metal layer, the second metal plug filling the second contact hole.

18. The semiconductor as claimed in claim 16, wherein the gap-fill layer is extended from the upper surface of the first barrier metal layer to the upper surfaces of the first metal plug and the first insulating layer.

19. The semiconductor as claimed in claim 16, further comprising:
- a first etching stop layer between the gap-fill layer and the second insulating layer;
- a second etching stop layer on the second insulating layer; and
- a metal hard mask layer on the second etching stop layer;
- wherein the second contact hole passes through the metal hard mask layer, the second etching stop layer, the second insulating layer and the first etching stop layer.

20. The semiconductor as claimed in claim 1, further comprising:
- an air gap disposed in the gap-fill layer, wherein the air gap is surrounded by the gap-fill layer.

* * * * *